(12) United States Patent
Minshall et al.

(10) Patent No.: US 6,815,349 B1
(45) Date of Patent: Nov. 9, 2004

(54) ELECTROLESS COPPER DEPOSITION APPARATUS

(75) Inventors: Edmund B. Minshall, Sherwood, OR (US); Kevin Biggs, Tualatin, OR (US); R. Marshall Stowell, Wilsonville, OR (US); Wayne Fetters, Canby, OR (US)

(73) Assignee: Novellus Systems, Inc., San Jose, CA (US)

( * ) Notice: Subject to any disclaimer, the term of this patent is extended or adjusted under 35 U.S.C. 154(b) by 152 days.

(21) Appl. No.: 10/274,837

(22) Filed: Oct. 18, 2002

Related U.S. Application Data

(63) Continuation-in-part of application No. 09/996,425, filed on Nov. 27, 2001, now Pat. No. 6,664,122.
(60) Provisional application No. 60/346,170, filed on Oct. 19, 2001.

(51) Int. Cl.[7] .............................................. H01L 21/44
(52) U.S. Cl. ....................................................... 438/678
(58) Field of Search ................... 438/17, 678; 239/703; 118/696

(56) References Cited

U.S. PATENT DOCUMENTS

| | | | |
|---|---|---|---|
| 5,151,168 A | | 9/1992 | Gilton et al. |
| 5,576,052 A | | 11/1996 | Arledge et al. |
| 5,674,787 A | | 10/1997 | Zhao et al. |
| 5,697,559 A | * | 12/1997 | Davis et al. ................. 239/703 |
| 5,824,599 A | | 10/1998 | Schacham-Diamond et al. |
| 5,891,513 A | | 4/1999 | Dubin et al. |
| 5,913,147 A | | 6/1999 | Dubin et al. |
| 5,938,845 A | | 8/1999 | Ang |
| 5,969,422 A | | 10/1999 | Ting et al. |
| 5,972,192 A | | 10/1999 | Dubin et al. |
| 6,056,215 A | * | 5/2000 | Hansinger et al. .......... 239/703 |
| 6,065,424 A | | 5/2000 | Shacham-Diamond et al. |
| 6,093,453 A | | 7/2000 | Ang |
| 6,136,707 A | | 10/2000 | Cohen |
| 6,197,181 B1 | | 3/2001 | Chen |

FOREIGN PATENT DOCUMENTS

| | | |
|---|---|---|
| WO | 99/47731 | 9/1999 |

OTHER PUBLICATIONS

Andryuschenko et al., "Electroless and Electrolytic Seed Repair Effects on Damascene Feature Fill," Proceedings of International Interconnect Tech. Conf., San Francisco Ca., Jun. 4–6, 2001; pp 33–35.

Chen et al., "EDC Seed Layer for Inlaid Copper Metallisation," Semiconductor Fabtech—12th Edition, 5 Pages, Jul. 2000.

Ken M. Takahashi, "Electroplating Copper into Resistive Barrier Films," Journal of the Electrochemical Society, 147 (4) 1417–1417 (2000).

(List continued on next page.)

*Primary Examiner*—David A. Zarneke
*Assistant Examiner*—Monica D. Harrison
(74) *Attorney, Agent, or Firm*—Beyer Weaver & Thomas LLP

(57) ABSTRACT

An apparatus for holding work pieces during electroless plating has certain improved features designed for use at relatively high temperatures (e.g., at least about 50 degrees C.). Cup and cone components of a "clamshell" apparatus that engage a work piece are made from dimensionally stable materials with relatively low coefficients of thermal expansion. Further, O-rings are removed from positions that come in contact with the work piece. This avoids the difficulty caused by O-rings sticking to work piece surfaces during high temperature processing. In place of the O-ring, a cantilever member is provided on the portion of the cone that contacts the work piece. Still further, the apparatus makes use of a heat transfer system for controlling the temperature of the work piece backside during plating.

31 Claims, 6 Drawing Sheets

OTHER PUBLICATIONS

T.P. Moffat et al., "Superconformal Electrodeposition of Copper in 500–90 nm Features," Journal of the Electrochemical Society, 147 (12) 4524–4535 (2000).

Ritzdorf et al., "Electrochemically Deposited Copper," Conference Proceedings ULSI XV 2000, Materials Research Society, 101–107.

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid-state.com, 86–103.

Reid et al., "Factors Influencing Fill of IC Features Using Electroplated Copper," Adv Met Conf Proc 1999, MRS 10 Pages, (2000).

Shacham–Diamond et al., "Copper Electroless Deposition Technology for Ultr–Large–Scale–Integration (ULSI) Metallization," Microelectronic Engineering 33 (1997) 47–58.

Mayer et al., "Methods and Apparatus For Airflow and Heat Management In Electroless Plating", Application No.: 10/272,693, Filed: Oct. 15, 2002, 35 pages.

* cited by examiner

ELECTROLESS COPPER DEPOSITION APPARATUS

CROSS REFERENCE TO RELATED APPLICATIONS

This application is a continuation-in-part claiming priority under 35 USC §120 from U.S. patent application Ser. No. 09/996,425, filed Nov. 27, 2001, now U.S. Pat. No. 6,664,122, titled "Electroless Copper Deposition Method for Preparing Copper Seed Layers", and naming Andryuschenko, et al. as the inventors; it also claims priority under 35 U.S.C. §119(e) from U.S. Provisional Patent Application No. 60/346,170, filed Oct. 19, 2001, titled "Hardware For Eletroless And Electroplating Of Ulsi Damascene Copper," and naming Mayer et al. as inventors. Both applications are incorporated herein by reference for all purposes. In addition, this application is related to U.S. patent application Ser. No. 6,664,122, filed Oct. 15, 2002, titled "Methods and Apparatus for Airflow and Heat Management in Electroless Plating", and naming Mayer, et al. as the inventors, which is also incorporated herein by reference for all purposes.

FIELD OF THE INVENTION

This invention relates to apparatus and methods for electroless plating on substrates. More specifically, the invention relates to improved apparatus for controlling engaging substrates during electroless plating in order to provide good plating performance at relatively high temperatures.

BACKGROUND

The Damascene process provides inlaid copper lines in dielectric layers of integrated circuits. The copper lines provide electrical routing (metal interconnects) between circuit elements in the integrated circuit. Damascene copper lines are rapidly replacing traditional aluminum etched lines in high-performance integrated circuitry.

Currently, a preferred method of metal-interconnect layer deposition is electroplating. This is in part due to the success of "bottom-up" copper filling methods for damascene features. The process typically involves formation of a barrier layer (typically composed of Ta, TiN or TiSiN) and a seed layer (typically copper) over the wafer, followed by plating the wafer to fill embedded structures from the bottom-up. A number of problems occur when trying to accomplish this task. Such problems include corrosion of the seed layer and associated reactions in the plating bath, poor structures (morphology) of PVD-deposited seed layers, non-uniform deposition of the metal over and into features, and shrinking of feature volume (and associated increase in aspect ratio) when seeded.

As features become smaller, the seed layer must become thinner (otherwise the feature will be closed off by the generally non-conformal PVD seeding process). However, most useful electroplating tool designs require supplying current to the wafer from the wafer's outer edge via the seed layer. When attempting to electroplate using ever thinner seed layers for supplying plating current, the current distribution becomes increasingly dominated by the resistance in the seed layer. This phenomenon is commonly referred to as the "terminal effect."

Thus, the need exists to find methods of depositing seed layers in a more conformal manner. This is because conformal seed layers reduce resistance by providing a greater average thickness in comparison to non-conformal layers deposited by PVD, for example. As a result, the terminal effect is mitigated during electroplating.

Electroless plating can provide highly conformal seed layers. And in some cases, electroless plating can replace not only PVD seed deposition, but electroplating as well, thereby dispensing with the need for a plating current and a seed layer. This, of course, circumvents the problems of the terminal effect and poor seed layer step coverage.

General process requirements for wafer plating include global and local plating uniformity, defect free process, and high throughput. In order to produce plating equipment for high-volume manufacturing (e.g., damascene copper processing) meeting these requirements, advances in electroless plating hardware design are required.

There are problems associated with available and proposed electroless plating apparatus. Most of these are due to heating. Electroless plating can take place at temperatures near room temperature, but to realize good performance for integrated circuit fabrication applications, it is preferably performed at higher temperatures, in the range of about 50 to 90 degrees C. As a consequence, electroless plating baths decompose to some degree during the plating process. In addition, conventional plating equipment can expand, deform, and/or stick to components during plating.

Some wafer electroplating apparatus can provide most of the functionality required for electroless plating. One example is the SABRE™ "clamshell" electroplating apparatus available from Novellus Systems, Inc. of San Jose, Calif. and described in U.S. Pat. Nos. 6,156,167 and 6,139,712, which are herein incorporated by reference in their entireties. The clamshell apparatus provides many advantages for wafer throughput and uniformity; most notably, wafer backside protection from contamination during electroplating, wafer rotation during the electroplating process, and a relatively small footprint for wafer delivery to the electroplating bath (vertical immersion path). During plating, it compresses the wafer between a "cup" and a "cone," thereby sealing off the backside of the wafer from contact with plating solution.

Modifications to the "clamshell" and its associated plating environment for improved wafer uniformity and quality have been described in U.S. Pat. Nos. 6,074,544, 6,110,346, 6,162,344, and 6,159,354 which are herein incorporated by reference in their entirety. The described modifications relate to methods for using variable currents, improved mass transfer, and electric potential shaping. Other documents providing details of the clamshell design include the following: U.S. patent application Ser. No. 09/927,741, filed Aug. 10, 2001, titled "Clamshell Apparatus For Electrochemically Treating Wafers", and naming Reid, et al. as the inventors; U.S. patent application Ser. No. 09/872,340, filed May 31, 2001, titled "Methods and Apparatus for Bubble Removal in Wafer Wet Processing", and naming Patton, et al. as the inventors; U.S. patent application Ser. No. 09/872,341, filed May 31, 2001, titled "Methods and Apparatus for Controlled-Angle Wafer Immersion", and naming Reid, et al. as the inventors; and U.S. patent application Ser. No. 09/927,740, filed Aug. 10, 2001, titled "Methods and Apparatus for Controlling Electrolyte Flow for Uniform Plating", and naming Mayer, et al. as the inventors.

Many features of the basic clamshell apparatus are suitable for electroless plating. However, some features must be modified to account for the relatively high temperatures required for electroless plating.

SUMMARY

The present invention addresses these needs by providing certain improved features of a clamshell plating apparatus designed for use at relatively high temperatures (e.g., at least about 50 degrees C.). It accomplishes this with judicious choices of construction materials and feature positioning. For example, the clamshell cup and cone components that engage the work piece are made from dimensionally stable materials with relatively low coefficients of thermal expansion. Further, O-rings are removed from positions that come in contact with the work piece. This avoids the difficulty caused by O-rings sticking to work piece surfaces during high temperature processing. In place of the O-ring, a cantilever member is provided on the portion of the cone that contacts the work piece. Still further, the invention may employ a heat transfer system for controlling the temperature of the work piece backside during plating.

One aspect of the invention pertains to apparatus for engaging a work piece during plating. Such apparatus may be characterized by the following features: (a) a cup having a circumferential side wall defining an interior region and a lip within the interior region arranged such that lip can support the work piece while the work piece remains within the interior region; (b) a cone having a work piece contact surface that fits within the cup's interior and can contact the work piece in a manner that holds the work piece in a fixed position against the cup's lip; and (c) a circumferential cantilever member provided on the contact surface, which cantilever member elastically deflects holding the work piece in the fixed position. Preferably, the cone's circumferential cantilever member and the work piece contact surface form a monolithic element. That is, they are formed from a single piece of material.

Preferably, the cantilever member has certain associated features such as a contact feature and a backing O-ring. The contact feature protrudes from a distal end region of the circumferential cantilever member and points toward the cup. Thus, the contact feature is the first portion of the cone to contact the work piece during engagement of the work piece. Typically, the contact feature is implemented as a circumferential ridge on the circumferential cantilever member. The O-ring is located in a slot behind the cantilever member so that it can impart a return force when the work piece is held in the fixed position.

Another aspect of the invention pertains to methods of plating a material onto a work piece. Such methods may be characterized by the following sequence: (a) loading a work piece onto a cup as described above; (b) engaging an exposed surface of the work piece with a cone having a circumferential cantilever member as described above, which elastically deflects while holding the work piece in the fixed position; and (c) plating a metal onto the work piece while engaged by the cup and cone. Preferably, the plating is an electroless plating operation taking place at a temperature of at least about 50 degrees Centigrade. To this end, the method will also require and operation of immersing the work piece in a plating fluid prior to plating.

Another aspect of the invention pertains to apparatus for heating and/or cooling a work piece during plating. Such apparatus may be characterized by the following: (a) a cup as described above; (b) a cone having a work piece contact surface that fits within the cup's interior and can contact the work piece as described above; and (c) a heating element in the cone. In this aspect of the invention, the cone's contact region is shaped to form a heat transfer fluid pathway between the work piece and the contact surface when the work piece is in the fixed position. To facilitate use of the heat transfer fluid, the apparatus will typically include both a heat transfer fluid inlet and a heat transfer fluid outlet in the cone. These are configured to handle either or both of a liquid and a gas heat transfer fluid (e.g., helium).

Preferably, the cone's contact region is shaped such that the heat transfer fluid pathway has a height of between about 100 and 500 micrometers. To produce the heat transfer fluid pathway, the cone's contact region may include at least one protruding contact feature pointing toward the cup. This feature will be the first portion of the cone to contact the work piece during engagement of the work piece. Therefore, it keeps the remainder of the cone's contact surface slightly separated from the work piece back side to define the heat transfer fluid pathway.

Yet another aspect of the invention pertains to methods of heating a work piece while plating a material onto that work piece. These methods may be characterized by the following operations: (a) loading the work piece onto a cup as described above; (b) engaging the exposed surface of the work piece with a cone as described (although the cantilever is not required); (c) plating a metal onto the work piece while engaged by the cup and cone; and (d) passing or maintaining a heat transfer fluid along the exposed surface of the work piece during plating. Preferably, the methods also heat the heat transfer fluid with a heating element provided within the cone.

The remainder of the specification will describe these and other features and advantages of the invention in further detail.

DETAILED DESCRIPTION OF THE PREFERRED EMBODIMENTS

Figure 1A:
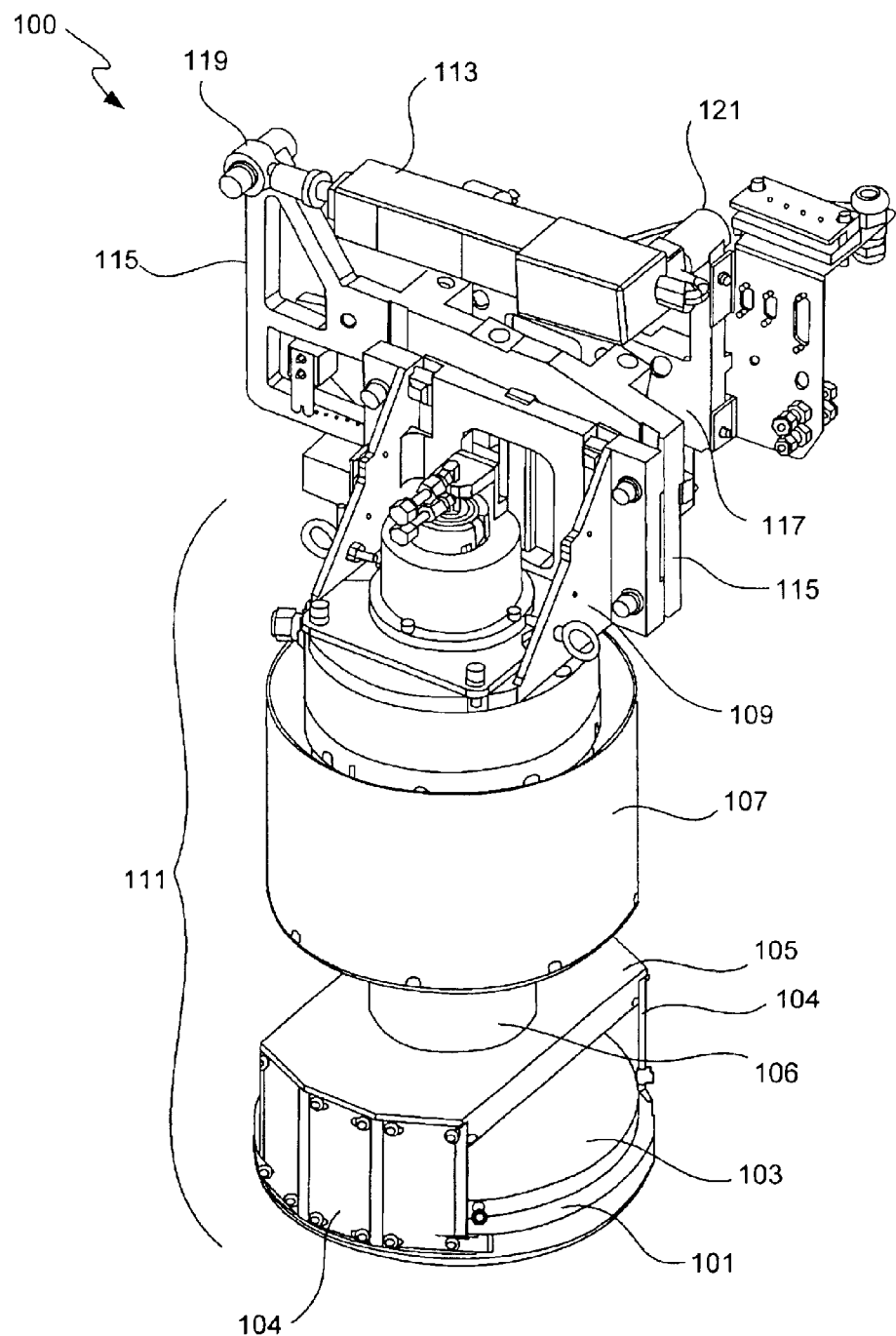
FIG. 1A depicts a wafer holder assembly for electrochemically treating semiconductor wafers used in accordance with the invention.
Figure 1B:
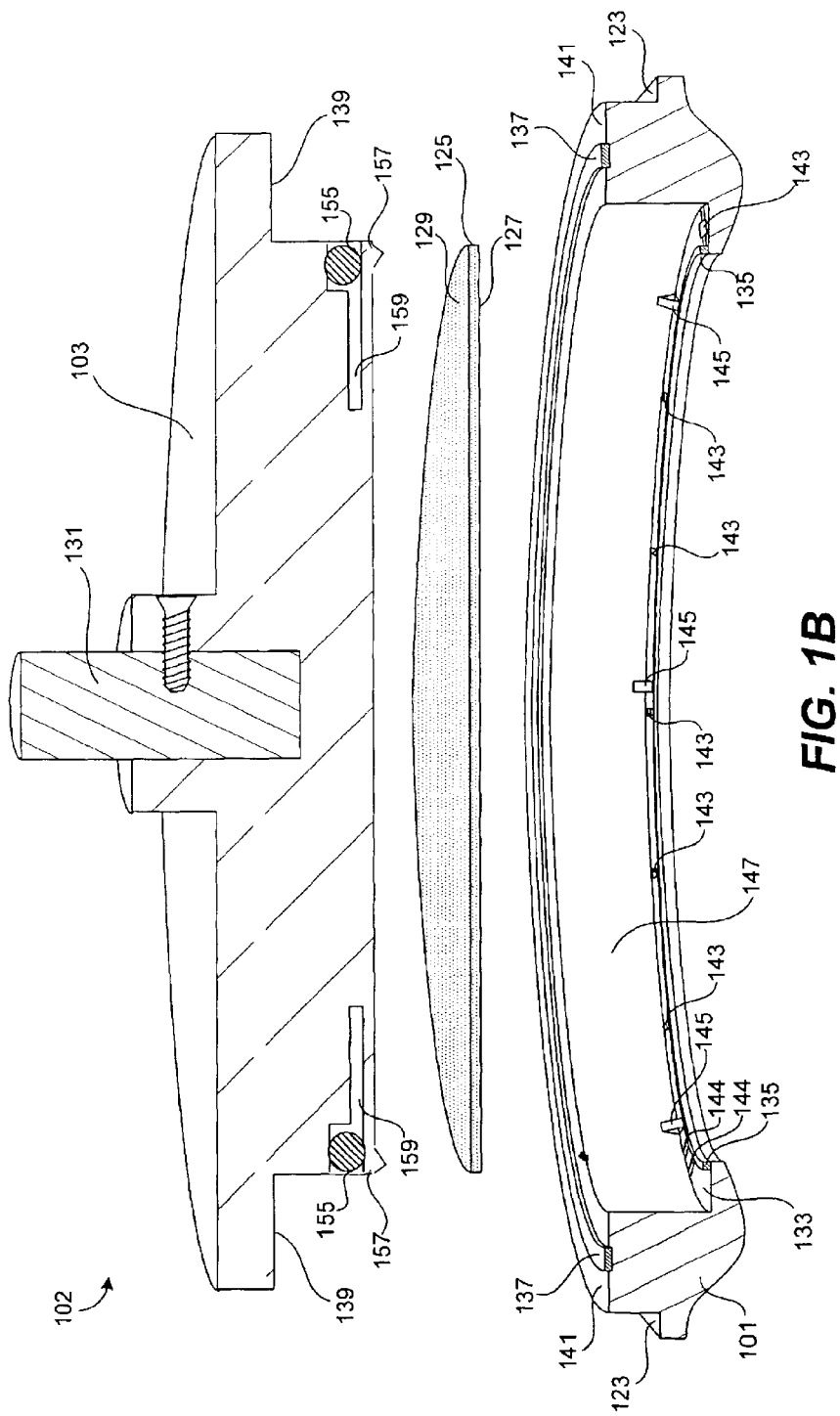
FIG. 1B is a cross sectional diagram depicting aspects of a cup and cone assembly of an electroplating apparatus in accordance with the invention.
Figure 1C:
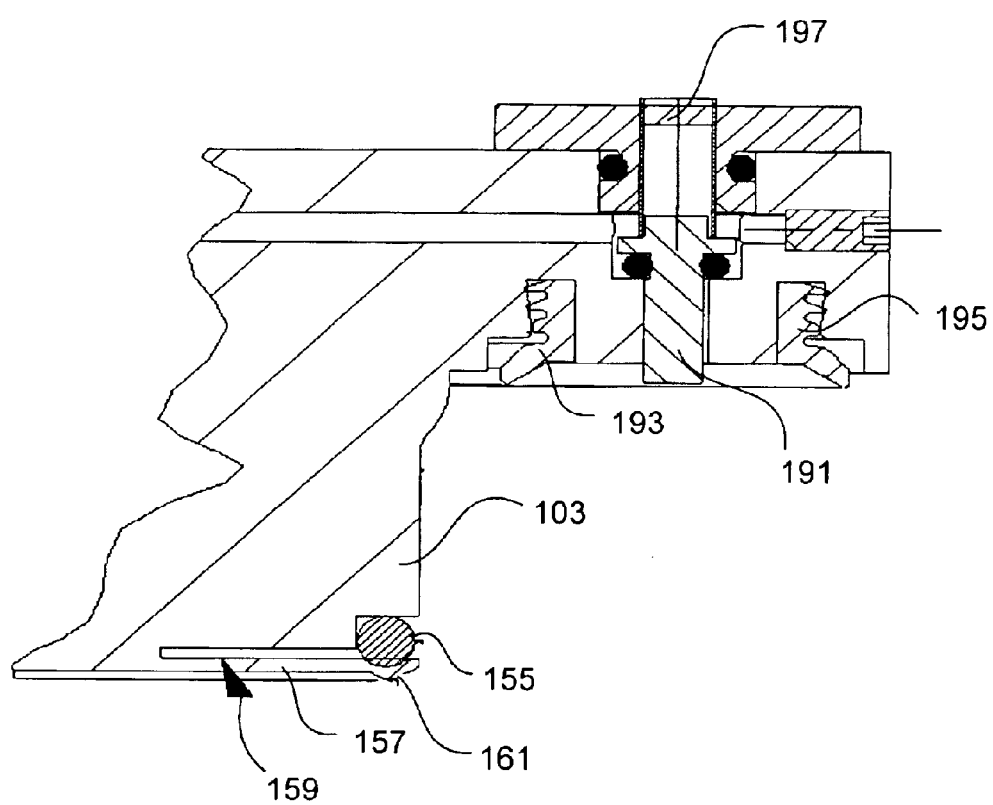
FIG. 1C is a cut away cross sectional diagram showing the cone and hidden O-ring in more detail.

Features of this invention pertain to the cup and cone arrangement of a wafer holder. FIGS. 1A through 1C put this arrangement in the context of a larger wafer holder for a plating apparatus.

Further, while the following description assumes that a work piece to be plated is a wafer; more particularly a semiconductor wafer, the invention is not so limited. The work piece may be of various shapes, sizes, and materials. In addition to semiconductor wafers, other work pieces that may take advantage of this invention include various conductive articles such as machine tools, weaponry, recording heads, recording media, and the like.

FIG. 1A provides an external perspective view of a wafer holding and positioning apparatus 100 for electrochemically treating semiconductor wafers. It includes wafer-engaging components (the "clamshell" components) that are the subject of this invention. The actual clamshell comprises a cup assembly 101 and a cone 103. As will be shown in later figures, cup assembly 101 holds a wafer and cone 103 clamps the wafer securely in the cup.

The clamshell assembly (cup 101 and cone 103) is supported by struts 104, which are connected to a top plate 105. This assembly (101–105) is driven by a motor 107, via a spindle 106. Motor 107 is attached to a mounting bracket 109. Spindle 106 transmits torque to a wafer (not shown in this figure) to allow rotation during electroless plating. An air cylinder (not shown) within spindle 106 also provides vertical force to clamp the wafer between cup 101 and cone 103. For the purposes of this discussion, the assembly including components 101–109 is collectively referred to as a wafer holder, 111. Note however, that the concept of a "wafer holder" extends generally to various combinations and subcombinations of components that engage a wafer and allow its movement and positioning.

A tilting assembly including a first plate 115 that is slidably connected to a second plate 117 is connected to mounting bracket 109. A drive cylinder 113 is connected both to plate 115 and plate 117 at pivot joints 119 and 121, respectively. Thus, drive cylinder 113 provides force for sliding plate 115 (and thus wafer holder 111) across plate 117. The distal end of wafer holder 111 (i.e. mounting bracket 109) is moved along an arced path (not shown), which defines the contact region between plates 115 and 117, and thus the proximal end of wafer holder 111 (i.e. cup and cone assembly) is tilted upon a virtual pivot.

The entire apparatus 100 is lifted vertically either up or down to immerse the proximal end of wafer holder 111 into an electroless plating solution via another actuator (not shown). Thus, a two-component positioning mechanism provides both vertical movement along a trajectory perpendicular to a solution and a tilting movement allowing deviation from a horizontal orientation (parallel to solution surface) for the wafer (angled-wafer immersion capability). A more detailed description of the movement capabilities and associated hardware of apparatus 100 is presented in U.S. patent application Ser. No. 09/872,341 previously incorporated by reference.

Note that the apparatus 100 is typically used with a particular electroless reactor having plumbing or plumbing connections for circulating electrolyte through the plating reactor—and against the work piece being plated. The electroless reactor may also include a separate membrane for controlling electrolyte flow patterns. For example, a diffuser membrane is employed for directing plating solution upward toward the rotating substrate in a uniform front. This embodiment is described in U.S. patent application Ser. No. 09/927,740, filed Aug. 10, 2001, naming Mayer et al. as inventors, and titled "Methods And Apparatus For Controlling Electrolyte Flow For Uniform Plating," which is incorporated herein by reference for all purposes.

FIGS. 1B and 1C show cup 101 and cone 103 in more detail and for consistency uses reference numbers from FIG. 1A. Specifically, FIG. 1B is a cross sectional depiction of a portion of assembly 100, including cup 101 and cone 103. Note that this figure is not meant to be an absolutely accurate depiction of the cup and cone assembly, but rather a stylized depiction for discussion purposes. Cup 101 is supported by top plate 105 via struts 104 (refer to FIG. 1A, struts 104 are secured to cup 101 in the area of outer edge 123 (depicted in FIG. 1B)). Cone 103 moves vertically within the assembly including the cup, struts, and top plate via air cylinder 131. Generally, cup 101 provides a support upon which wafer 125 rests. It includes an opening through which electrolyte from a plating cell can contact the wafer. Note that wafer 125 has a front side 127, which is where plating occurs. Only the periphery of wafer 125 rests on the cup. When engaged with cup 101, cone 103 presses down on the back side of the wafer, 129, to hold it in place during electroless plating.

To load a wafer into the assembly, cone 103 is held in a raised position, as depicted, via air cylinder 131 (until cone 103 touches top plate 105). From this position, a gap is created between the cup and the cone into which wafer 125 can be inserted, and thus loaded into the cup. Note in FIG. 1A that struts 104 are positioned on opposing sides of cup 101, covering only part of its circumference, thus the wafer is inserted between the opposing struts. Once the wafer is resting on cup 101, cone 103 is lowered to engage the wafer against the periphery of cup 101. As indicated, wafer plating preferably occurs while the wafer is rotating. If electroless plating solution flows upward towards the wafer, the rotation provides nearly uniform mass transfer to the wafer over the entire radial extent of the wafer.

Cup 101 supports wafer 125 via a lip 133. More specifically, the lip has a compressible lip seal 135, which forms a fluid-tight seal when cone 103 engages wafer 125 against lip seal 135. The lip seal prevents electroless plating solution from contacting the backside of wafer 125 (where it could introduce contaminating atoms such copper directly into silicon) and from contacting sensitive components of apparatus 101. Also shown is seal 137, which is also compressed (between ledge 139 of the cone and surface 141 of the cup) to form a fluid tight seal when cone 103 engages wafer 125. Thus, once the cup and cone are engaged, the wafer backside is protected from solution exposure. Again, this figure is a simplified depiction.

As mentioned, before initiation of electroless plating, wafer 125 is introduced to the assembly when cone 103 is raised above cup 101. When the wafer is initially introduced—typically by a robot end effector—its outermost edge rests lightly on lip seal 135. Connections 143 and 144 are provided for use with a circuit that measures resistance of the copper seed layer deposited on the wafer. See U.S. Pat. No. 09/996,425, filed Nov. 27, 2001, and naming Andryuschenko, et al. as inventors, previously incorporated herein by reference.

Also shown in FIG. 1B, on lip 133 of cup 101, are a plurality of wafer guides, 145. These guides are used to orient wafer 125 such that its outermost edge aligns accurately with lip seal 135. Note, cup 101 includes a circumferential side wall 147 which defines an interior region of the cup and a lip 133 for supporting wafer 125. The invention is not limited to cups of this shape or configuration. A "cup" of the invention can include a similar structure not having a circumferential side wall. For example, a ring structure with a flat top surface (including an inner edge or "lip") and only wafer guides 145 may define a "cup" in the context of this invention. To facilitate processing at temperatures in excess of 60 degrees C., cup 101 is preferably made from a dimensionally stable material such as a ceramic, plastic-coated ceramic, plastic-coated metal, or composite.

Cone 103 will now be described in more detail with reference to FIGS. 1B and 1C. Importantly, cone 103 includes a cantilever member 157 disposed about the perimeter of a wafer contact surface. Cantilever member 157 is defined by a circumferential slot 159. The role of member 157 is to provide some deformation when the cone contacts the wafer to thereby minimize the risk of damage to the wafer and cone. Because the remaining material below the slot (on the contact surface of cone 103) is relatively thin, it is easily deflected by the forces it experiences when engaging the wafer.

Preferably, though not necessarily, an O-ring 155 is disposed within slot 159 to provide a restoring force when a wafer impinges on the cone. Note that, as depicted, slot 159 has a thin interior region defining the majority of cantilever member 157. It also has a wider peripheral region sized to accommodate O-ring 155. Further, cantilever member 157 preferably includes a contact feature 161 protruding from its distal end as shown in FIG. 1C. Feature 161 provides the initial contact surface for cone 103 as it engages wafer 125 to hold it fixed position. Preferably contact feature 161 is a simple ridge or other protrusion located on the distal region of the cantilever member, although it is not necessarily located at the very end as depicted in FIG. 1C.

In one preferred embodiment, the length of cantilever member 157 (in the radial direction) is between about 15 and 16 millimeters. The interior region of slot 159 is preferably between about 0.5 and 1 millimeters thick (in the axial direction). To the extent that a contact feature is employed, it preferably protrudes to a distance of between about 0.2 and 0.7 below the principal surface of cone 103. Because cantilever 157 is a flexural member, it must be manufactured to withstand anticipated mechanical stresses. To minimize the possibility of failures due to fatigue, the height of member 157 is preferably between about 0.7 and 1.2 mm thick. Also, the selection of O-ring (155) size and dimension, as well as the height of the larger portion of slot 159 (the O-ring seat) must be determined such that the desired force/deflection characteristics are obtained. In the preferred embodiment depicted, the O-ring is approximately 50 durometer, between 280 and 290 mm outside diameter, and the O-ring seat dimension is between 2.8 and 3 mm.

Another feature shown in FIG. 1C is the poppet valve 191 used to create additional sealing force between the cup and cone. Within the construction of the cone, there exist two annular seals 193 and 195 between which a vacuum is drawn. The application of vacuum is mechanically controlled via the poppet valve; because the actuator extends below the cone (by approximately 0.055" in one example), the poppet valve is actuated shortly before the cone physically contacts the cup. A cover 197 is affixed over the poppet valve to prevent debris or chemical solution from interfering with proper valve actuation (and to prevent these same from contaminating other parts of the system via vacuum ingestion).

As indicated, to account for the relatively high temperature environment of electroless plating, the cup and cone should be made from temperature stable materials. Preferably, the cone (particularly the circumferential cantilever member and contact feature, if any) retains its mechanical toughness (ability to withstand deflection), hardness and surface finish, thereby eliminating the problem of wafers sticking to the backside of the wafer at elevated temperatures. Therefore, the material comprising the cone preferably exhibits minimal thermal expansion and thermal distortion. In a preferred embodiment of this invention, the cone is made of a chemically compatible and inert polymer possessing an elastic modulus greater than 3.0 GPa, a CTE (coefficient of thermal expansion) of less than 40 $\mu$m/m/° C., a water absorbtion of less than 0.25%, and high toughness (e.g., PPS (polyphenylene sulfide), Vespel (DuPont), or PEEK (polyetheretherketone)). PPS is used in an especially preferred embodiment due to a combination of superior material properties, though one skilled in the art could certainly identify additional materials of similarly suitable properties. The O-ring is made of a chemically compatible fluoroelastomer of low durometer (e.g., "Viton"® a fluoroelastomer available from DuPont Dow Elastomers, LLC, Chernaz—Greene, Tweed & Co, or Kalrez—DuPont), although alternate materials and construction techniques can be adopted by one skilled in the art. In its essence, the cone deflection mechanism of this invention comprises a compliant member for chemical/thermal/environmental compatibility, optionally backed by an elastomeric member for added compliance/dimensional performance.

Figure 2A:
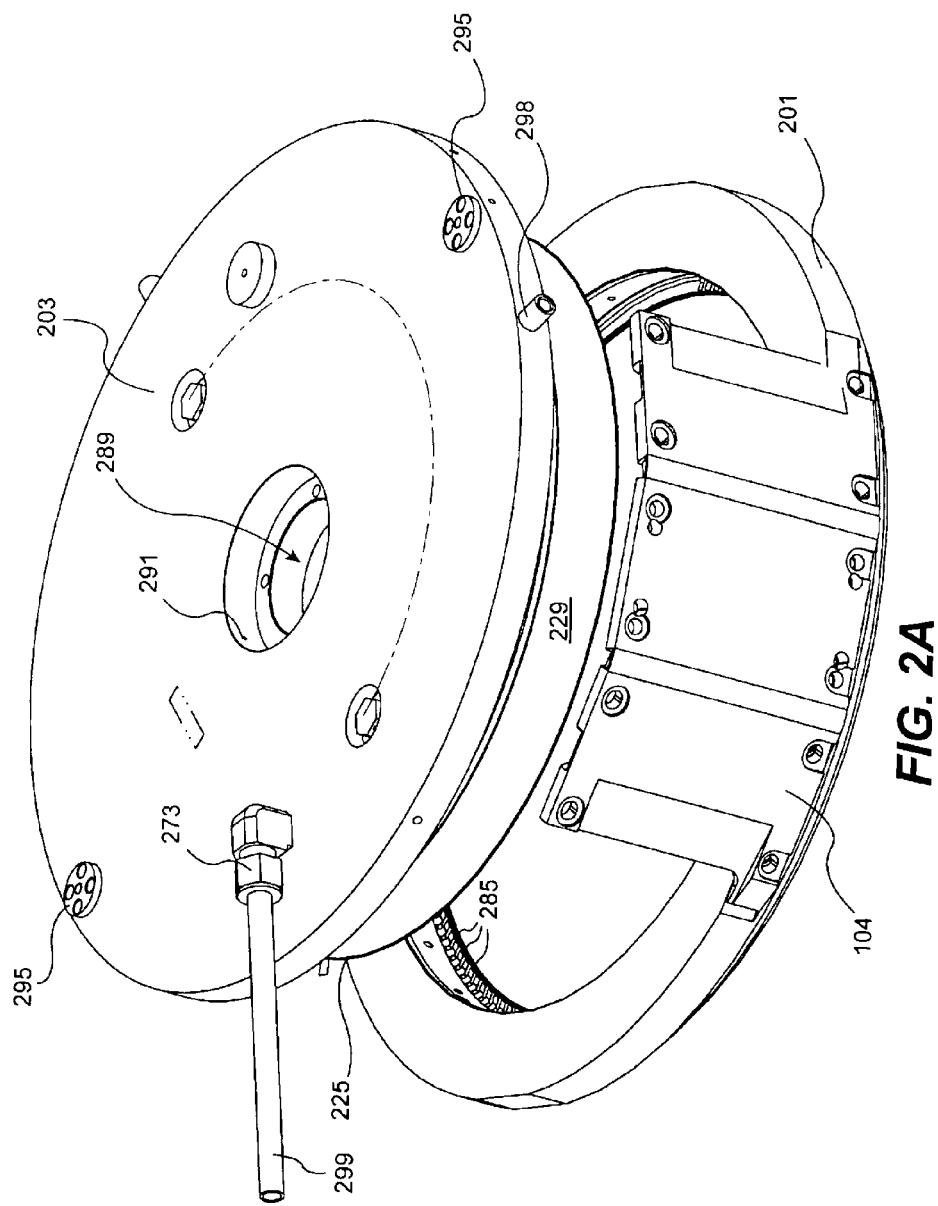
FIG. 2A is an exploded diagram of a cup and cone in perspective showing certain aspects of a wafer heat transfer system of this invention.
Figure 2B:
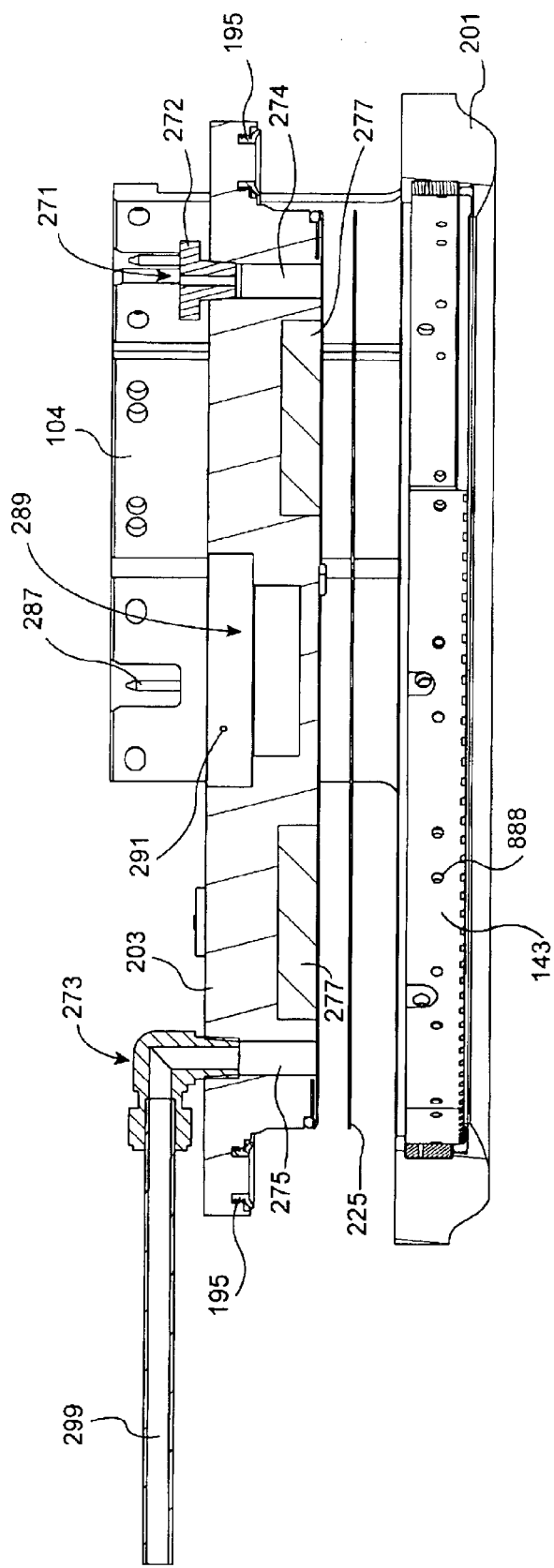
FIG. 2B is a cross sectional diagram depicting further aspects of the heat transfer system of FIG. 2A.

As illustrated in FIG. 2B, the electrical contacts, 143, are held in position via screws installed into threaded inserts, 888, which are in turn bonded into the cup, 201. These inserts, 888, are preferably made from Kovar® (the nickel alloy of Carpenter Technology) to approximately match the coefficient of thermal expansion (CTE) of the ceramic cup. If additionally, the cone 103 is made of low CTE PPS, as indicated, the service temperature on a 300 mm electroless clamshell, has been found to be from 60° C. to in excess of 90° C.

Because electroless deposition does not require an electrical potential to drive deposition, it follows that it is not possible to prevent metallic deposition on surfaces (sometimes referred to as "plate-out") within the plating solution containment vessel (and other immersed parts) by simple electrical isolation. Because metallic surfaces are more susceptible to plate-out than others, it is therefore advantageous to employ non-metallic surfaces that are not easily wetted. This includes the cup and cone and associated components such as struts, alignment pins, etc. In some cases, the hardware can be coated with a non-metallic non-wetting material such as Teflon (DuPont) or Halar (ECTFE, or ethylene chlorotrifluoroethylene).

Figure 2C:
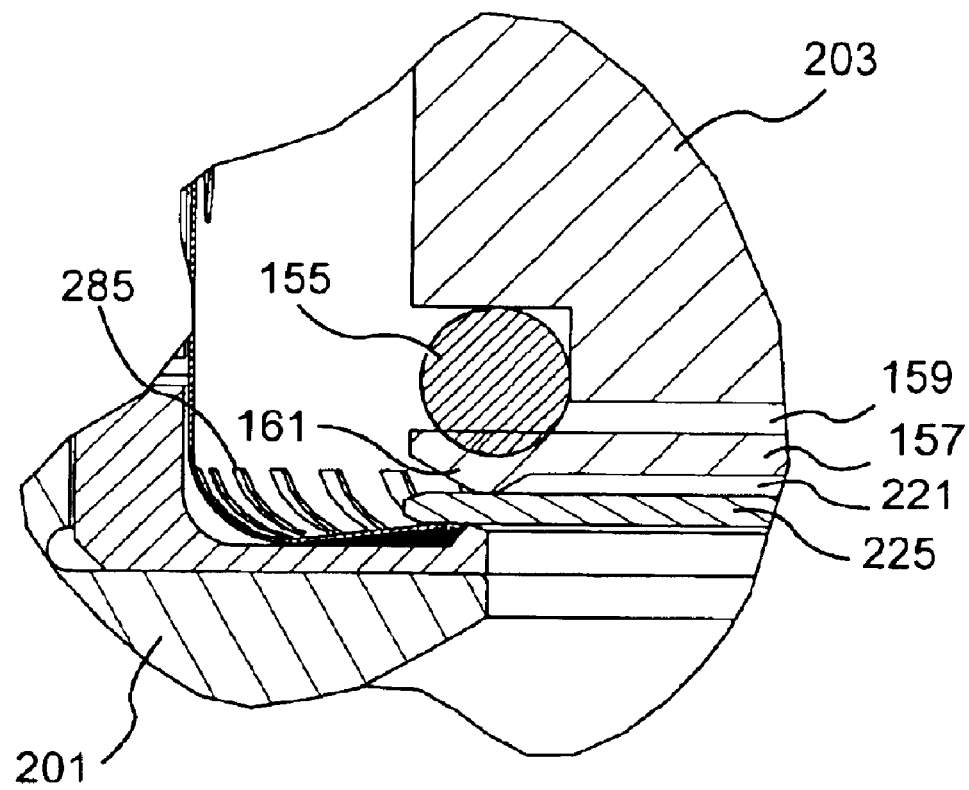
FIG. 2C is a cut away cross sectional diagram highlighting a gap where a heat transfer fluid can flow between the cone contact surface and the wafer back side.

Another aspect of this invention provides improved heat transfer to the back side of the work piece during electroless plating. This aspect of the invention will be described in the context of a clamshell cup and cone arrangement 202 as depicted in FIGS. 2A-2C. The exploded views of FIGS. 2A and 2B show a cup 201, wafer 225, and cone 203. The cone 203 includes two ports: an inlet 273 and an outlet 271 for transmitting a heat transfer fluid. FIG. 2B shows that outlet 272 is provided with a restriction value 271 at the entrance to a port 274 in the body of cone 203. Inlet 273 comprises a tube 299 attached to port 275. During plating, the heat transfer fluid enters the cone via port 275, passes over the back side of the wafer along a thin gap between the wafer and the cone contact surface, and then exits via port 274.

An additional feature of the heat transfer system is a heater (or cooler) depicted as an annular heating element 277 within cone 203 (FIG. 2B). This element may be a resistive element or other suitable heat source/sink such as an IR irradiation element, Peltier thermoelectric heat pump, or simple radiative heat exchanger. It preferably transfers heat energy directly to/from the cone surface at the boundary with the wafer. The combination of a heater/cooler and a flowing heat transfer fluid provides thermal uniformity over the wafer backside, as the heat transfer fluid transfers heat from the heater to the wafer (or vise verse). It should be clear to one skilled in the art that the heating/cooling element may also be located externally, using heated/cooled thermal transfer fluid to effect wafer temperature.

FIG. 2C shows, in greater detail, a section of a gap 221 between the cone contact surface (including cantilever member 157) and wafer 225. This gap provides the passage for the heat transfer fluid over the wafer back side. The gap is created by contact feature 161 at the distal end of cantilever member 157. In a preferred embodiment, the gap is between about 100 and 700 micrometers, more preferably about 400–500 micrometers. This provides ample room for a flowing heat transfer media. Preferably, the heat transfer medium is a gas, but other forms will work as well (e.g., a liquid or even a gel). A gel would lend itself to static heat transfer, though it's not necessarily restricted from flowing. Likewise, gasses and liquids can work in a static system, though performance would likely improve with flow. If a gaseous heat transfer fluid is used in a static condition, one might replace the orifice with a pressure relief valve to conserve gas. In a particularly preferred embodiment of this invention, helium is the heat transfer fluid. Helium readily transfers heat from the heater to the wafer (or vise verse) and thereby provides good thermal uniformity over the wafer backside area of contact. Those of skill in the art will recognize that a broad range of other heat transfer media may be appropriate. Examples include helium mixtures, hydrogen, air, steam, water, and the like.

Note that O-ring 155 is shown in FIG. 2C, disposed above cantilever member 157. In addition, various contact fingers 285 for providing electrical contact to wafer 225 and allowing metal film thickness monitoring by metrology circuits. In FIGS. 2A and 2C, various plate support struts 104 are shown arranged about the perimeter of cup 201. These struts are used to rigidly and accurately locate the cup 201 below the top plate (105) of FIG. 1A. Within these struts are located contact rods 287 which are electrically connected to the contacts, 285, enabling passage of electrical current or voltage from the cup assembly into the rest of the clamshell assembly, 100, or beyond. The vertically oriented plate portions of contacts, 285, are the most prominent features in FIG. 2A. In addition to providing electrical contacts for metrology (and plating current in electroplating applications), they are also used to lift the wafer for removal from the clamshell apparatus. In addition, the cone 203 includes cylindrical bores 289 for engaging a spindle used to rotate the clamshell apparatus, together with the fixed wafer.

FIGS. 2A-2C also depict certain features associated with vacuum engagement between cup 201 and cone 203. For example, bore 289 includes a small vacuum port 291, through which a vacuum is drawn to locations within cone 203. The annular vacuum lip seals 193 and 195 (along the upper perimeter of cone 203) provide vacuum engagement between cup 201 and cone 203. In addition, two poppet valves 295 shown in FIG. 2A on cone 203 sense contact between the cup and cone. When contact occurs, the valves allow the vacuum seal to form at lip seal 293.

Also shown in FIG. 2A is a rotation stop 298 which prevents the cone 203 from rotating relative to the cup 201. The stop 298 protrudes radially outward beyond the strut 104 and contacts along its side. While the clamshell assembly remains functional without the rotation stop, it is preferably included to prevent rotational shear between the wafer top and bottom surfaces (which will result in increased particulate contamination).

Obviously, the embodiments shown in the above figures are very specific embodiments that possess many features not required to practice the invention. In addition, some design details have been omitted for clarity's sake. Those of skill in the art will understand that various design alternatives may be implemented. Further, while the specification has focused on electroless plating applications, the apparatus disclosed herein may be used in electroplating applications as well. In view of such natural extensions, the present examples are to be considered illustrative and not restrictive, and the invention is not to be limited to the details given herein, but is defined within the scope of the appended claims.

What is claimed is:

1. An apparatus for engaging a work piece during plating, the apparatus comprising:
    a cup having a circumferential side wall defining an interior region and a lip within the interior region arranged such that lip can support the work piece while the work piece remains within the interior region;
    a cone having a work piece contact surface that fits within the cup's interior and can contact the work piece in a manner that holds the work piece in a fixed position against the cup's lip;
    a circumferential cantilever member provided on the contact surface, which cantilever member elastically deflects holding the work piece in said fixed position.

2. The apparatus of claim 1, further comprising a contact feature protruding from a distal end region of the circumferential cantilever member and pointing toward the cup, whereby the contact feature is the first portion of the cone to contact the work piece during engagement of the work piece.

3. The apparatus of claim 2, wherein the contact feature is a circumferential ridge on the circumferential cantilever member.

4. The apparatus of claim 1, further comprising a circumferential slot located proximate the contact surface of the cone, thereby defining the circumferential cantilever member.

5. The apparatus of claim 1, wherein the circumferential cantilever member and the work piece contact surface of the cone form a monolithic element.

6. The apparatus of claim 1, further comprising an O-ring disposed against the circumferential cantilever member in a manner imparting a return force when the work piece is held in said fixed position.

7. The apparatus of claim 6, further comprising a circumferential slot located proximate the contact surface of the cone, thereby defining the circumferential cantilever member, wherein the O-ring resides in the circumferential slot.

8. The apparatus of claim 1, wherein the cone is made from a material selected from the group consisting of PPS and PEEK.

9. The apparatus of claim 1, further comprising one or more actuators for moving the work piece into and out of a plating fluid, while the work piece is held in said fixed position by the cup and cone.

10. A method of depositing a material onto a work piece, the method comprising:
    loading a work piece onto a cup having a circumferential side wall defining an interior region and a lip within the interior region arranged such that lip can support the work piece while the work piece remains within the interior region, wherein the work piece has an exposed surface opposite the cup;
    engaging the exposed surface of the work piece with a cone having a work piece contact surface that fits within the cup's interior and can contact the work piece in a manner that holds the work piece in a fixed position against the cup's lip, wherein a circumferential cantilever member provided on the contact surface elastically deflects while holding the work piece in said fixed position; and
    plating a metal onto said work piece while engaged by said cup and cone.

11. The method of claim 10, wherein the plating is electroless plating conducted at a temperature of at least about 50 degrees C.

12. The method of claim 10, further comprising immersing the work piece in a plating fluid prior to plating.

13. The method of claim 10, wherein work piece is a semiconductor wafer.

14. The method of claim 10, wherein the work piece is positioned on a lipseal of the lip to thereby provide a fluid tight seal with the work piece when the work piece is held in place by the cone.

15. The method of claim 10, wherein the circumferential cantilever member comprises a contact feature protruding from a distal end region of the circumferential cantilever member and pointing toward the cup, whereby the contact feature is the first portion of the cone to contact the work piece during the engaging of the work piece.

16. The method of claim 15, wherein the contact feature is a circumferential ridge on the circumferential cantilever member.

17. The method of claim 10, wherein an O-ring is disposed against the circumferential cantilever member in a manner imparting a return force when the work piece is held in said fixed position.

18. The method of claim 10, further comprising moving the work piece into and out of a plating fluid, while the work piece is held in position by the cup and cone.

19. An apparatus for engaging a work piece during plating, the apparatus comprising:
   a cup having a circumferential side wall defining an interior region and a lip within the interior region arranged such that lip can support the work piece while the work piece remains within the interior region;
   a cone having a work piece contact surface that fits within the cup's interior and can contact the work piece in a manner that holds the work piece in a fixed position against the cup's lip; and
   a heating element in said cone,
   wherein the cone's contact region is shaped to form a heat transfer fluid pathway between the work piece and the contact surface when the work piece is in the fixed position.

20. The apparatus of claim 19, further comprising:
   a heat transfer fluid inlet in the cone; and
   a heat transfer fluid outlet in the cone.

21. The apparatus of claim 20, wherein the heat transfer fluid inlet and outlet are configured for handling a liquid or a gas heat transfer fluid.

22. The apparatus of claim 21, wherein the heat transfer fluid inlet and outlet are configured for handling helium as the heat transfer fluid.

23. The apparatus of claim 19, wherein the cone's contact region is shaped such that the heat transfer fluid pathway has a height of between about 100 and 700 micrometers.

24. The apparatus of claim 19, wherein the cone's contact region includes at least one protruding contact feature pointing toward the cup, whereby the contact feature is the first portion of the cone to contact the work piece during engagement of the work piece and thereby forms the heat transfer fluid pathway.

25. The apparatus of claim 19, wherein the heating element comprises an electrically resistive, thermoelectric, and/or radiative element.

26. A method of depositing a material onto a work piece, the method comprising:
   loading a work piece onto a cup having a circumferential side wall defining an interior region and a lip within the interior region arranged such that lip can support the work piece while the work piece remains within the interior region, wherein the work piece has an exposed surface opposite the cup;
   engaging the exposed surface of the work piece with a cone having a work piece contact surface that fits within the cup's interior and can contact the work piece in a manner that holds the work piece in a fixed position against the cup's lip;
   plating a metal onto said work piece while engaged by said cup and cone; and
   passing or maintaining a heat transfer fluid along the exposed surface of the work piece during plating.

27. The method of claim 26, further comprising heating or cooling the heat transfer fluid with a heating or cooling element provided within the cone.

28. The method of claim 26, further comprising:
   introducing the heat transfer fluid to a heat transfer fluid inlet in the cone; and
   removing the heat transfer fluid via a heat transfer fluid outlet in the cone.

29. The method of claim 26, wherein the heat transfer fluid passes through a heat transfer fluid pathway between the cone's contact region and the work piece exposed surface.

30. The method of claim 29, wherein the heat transfer fluid pathway has a height of between about 100 and 500 micrometers.

31. An apparatus for engaging a work piece during plating, the apparatus comprising:
   a cup having a circumferential side wall defining an interior region and a lip within the interior region arranged such that lip can support the work piece while the work piece remains within the interior region;
   a cone having a work piece contact surface that fits within the cup's interior and can contact the work piece in a manner that holds the work piece in a fixed position against the cup's lip; and
   a heat transfer element, located external to the cone, for heating or cooling a heat transfer fluid,
   wherein the cone's contact region is shaped to form a heat transfer fluid pathway between the work piece and the contact surface when the work piece is in the fixed position.

* * * * *